United States Patent
Hong (10) Patent No.: US 7,482,262 B2
(45) Date of Patent: Jan. 27, 2009

(54) METHOD OF MANUFACTURING SEMICONDUCTOR DEVICE

(75) Inventor: Ji Ho Hong, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 252 days.

(21) Appl. No.: 11/559,592

(22) Filed: Nov. 14, 2006

(65) Prior Publication Data

US 2007/0155123 A1 Jul. 5, 2007

(30) Foreign Application Priority Data

Nov. 15, 2005 (KR) .................... 10-2005-0109055

(51) Int. Cl.
*H01L 21/44* (2006.01)

(52) U.S. Cl. .................. 438/624; 438/710; 438/711; 438/714; 438/723; 438/728; 257/E21.079; 257/E21.257; 257/E21.507; 257/E21.546; 257/E21.579

(58) Field of Classification Search .............. 438/424, 438/435, 437, 624, 637, 638, 710, 711, 714, 438/715, 723, 724, 728, 758; 257/E21.029, 257/252, 257, 507, 546, 577, 579
See application file for complete search history.

(56) References Cited

U.S. PATENT DOCUMENTS

| | | | | |
|---|---|---|---|---|
| 6,319,796 B1 * | 11/2001 | Laparra et al. | ............ | 438/435 |
| 6,361,705 B1 * | 3/2002 | Wang et al. | .................... | 216/39 |
| 6,403,491 B1 * | 6/2002 | Liu et al. | .................... | 438/710 |
| 6,544,429 B1 * | 4/2003 | Hung et al. | .................... | 216/67 |
| 6,664,177 B1 * | 12/2003 | Lin et al. | .................... | 438/624 |
| 7,060,626 B2 * | 6/2006 | Bandy et al. | ................ | 438/714 |
| 7,176,126 B2 * | 2/2007 | Oh et al. | .................... | 438/638 |
| 7,262,127 B2 * | 8/2007 | Ishikawa | .................... | 438/622 |

* cited by examiner

*Primary Examiner*—Michael S Lebentritt
(74) *Attorney, Agent, or Firm*—Sherr & Vaughn, PLLC (57) ABSTRACT

Disclosed are embodiments relating to a method of manufacturing a semiconductor device that may improve the yield rate of the semiconductor device. In embodiments, the method may include preparing a substrate including a plurality of conductive patterns, forming first and second insulating layers on the substrate, forming a plurality of via holes by selectively etching the first and second insulating layers, forming a plurality of trenches by selectively etching the second insulating layer in such a manner that the trenches are communicated with the trenches, and forming metal interconnections in the via holes and the trenches. The width ratio of the trench to the insulating layer positioned between adjacent trenches may be in a range of 0.45 to 0.55.

20 Claims, 10 Drawing Sheets

METHOD OF MANUFACTURING SEMICONDUCTOR DEVICE

The present application claims priority under 35 U.S.C. 119 and 35 U.S.C. 365 to Korean Patent Application No. 10-2005-0109055 (filed on Nov. 15, 2005), which is hereby incorporated by reference in its entirety.

BACKGROUND

Embodiments relate to a semiconductor device and a method of fabricating a semiconductor device, which may improve a yield rate.

To fabricate a semiconductor device, an inter-metal dielectric layer, for example including FSG (fluorine silicate glass), may be formed through a BEOL (Back-End-Of-Line) process. A metal interconnection, for example including copper (Cu), may then be formed on the inter-metal dielectric layer. In such a semiconductor device, a damascene process may be used, instead of a metallization process using a subtractive scheme, to form a metal interconnection that may include aluminum (Al). Thus, although the BEOL process has been changed, the process has not yet been optimized.

Since the process conditions have not yet been optimized, a yield rate of a semiconductor device may be significantly lowered.

SUMMARY

Embodiments may provide a method of manufacturing a semiconductor device having a higher yield rate by reducing or eliminating factors that may cause degradation of the yield rate, to provide more optimal process conditions.

In embodiments, a method of manufacturing a semiconductor device may include preparing a substrate including a plurality of conductive patterns, forming an insulating layer on the substrate, forming a plurality of trenches by selectively etching the insulating layer, and forming a metal interconnection in each trench, wherein a width of the insulating layer positioned between adjacent trenches is in a range of 0.185 µm to 0.225 µm.

In embodiments, a method of manufacturing a semiconductor device may include preparing a substrate including a plurality of conductive patterns, forming first and second insulating layers on the substrate, forming a plurality of via holes by selectively etching the first and second insulating layers, forming a plurality of trenches by selectively etching the second insulating layer in such a manner that the trenches are communicated with the via holes, and forming metal interconnections in the trenches and via holes, wherein a width of the insulating layer positioned between adjacent trenches is in a range of 0.185 µm to 0.225 µm.

In embodiments, a method of manufacturing a semiconductor device may include preparing a substrate including a plurality of conductive patterns, forming an insulating layer on the substrate, forming a plurality of trenches by selectively etching the insulating layer, and forming a metal interconnection in each trench, wherein a width ratio of the trench to the insulating layer positioned between adjacent trenches is in a range of 0.45 to 0.55.

In embodiments, a method of manufacturing a semiconductor device may include preparing a substrate including a plurality of conductive patterns, forming first and second insulating layers on the substrate, forming a plurality of via holes by selectively etching the first and second insulating layers, forming a plurality of trenches by selectively etching the second insulating layer in such a manner that the trenches are communicated with (i.e. connect with) the via holes, and forming metal interconnections in the via holes and the trenches, wherein a width ratio of the trench to the insulating layer positioned between adjacent trenches is in a range of 0.45 to 0.55.

The foregoing general description and the following detailed description of embodiments are intended to be are exemplary and explanatory, and are intended to provide further explanation of the claimed embodiments.

BRIEF DESCRIPTION OF THE DRAWINGS

Example

Example

Example

Example

Example

Example

Example

Example

Example

Example

Example

Example

DETAILED DESCRIPTION

Certain factors that may cause degradation of a semiconductor yield rate have been identified through various experiments.

A semiconductor device used to analyze and monitor the yield rate, and used in the split test to improve a yield rate may include a core area having a transistor operating with a driving voltage of about 1.2V and an input/output (I/O) area having a transistor operating with a driving voltage of about 3.3V. The transistors may have STI (shallow trench isolation) structures.

The transistors may have a cobalt salicide (Co salicide), an IMD (Inter Metal Dielectric) layer including FSG, and a Cu interconnection. The Cu interconnection may be prepared in the form of a multi-layer structure, for example through a damascene process.

A yield rate of a semiconductor device may be represented by the yield rate of SRAM blocks. This is because the SRAM area is designed in view of the design rule. Thus, a yield rate described with respect to embodiments may refer to the yield rate of SRAM. In addition, according to embodiments, a GL13 reticle may include four 4M SRAM yield monitoring blocks R2 to R5. The blocks may have the same area.

The experiments for identifying certain factors that may lower a yield rate may be performed in two steps.

One step is to determine the level of a yield rate and identify factors that may lower the yield rate to quantitatively standardize such factors.

Another step is to reduce and/or remove the factors identified as tending to lower the yield rate in an effort to improve the yield rate.

Figure 1:
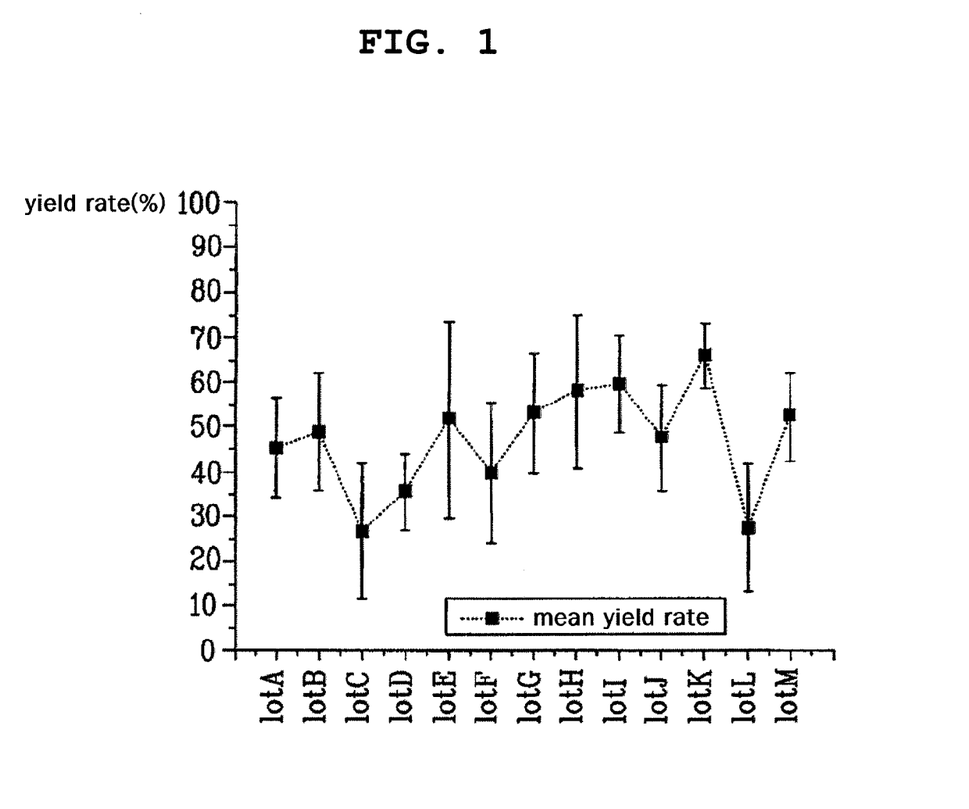
FIG. 1 is a graph illustrating a yield rate of 0.13 µm FCT.

Example FIG. 1 is a graph illustrating a yield rate of semiconductor devices, resulting from a monitoring of 13 lots. These results may assist in analyzing the level of the SRAM yield rate and quantitatively detect factors that tend to lower a yield rate.

The mean yield rate of the 13 lots is 47.1%. The lots thus exhibit relatively low yield rates as a whole. The difference of the yield rate between lot K (which has the highest yield rate) and lot C (which has the lowest yield) rate is 39.2%. This indicates that that the yield rate is not consistent.

The yield rate of individual wafers in each lot may then be checked. This check revealed that in nine lots (lots E to M) of the 13 lots, the process sequence of the wafers relates to slot dependency (sometimes referred to as S/D).

Figure 2:
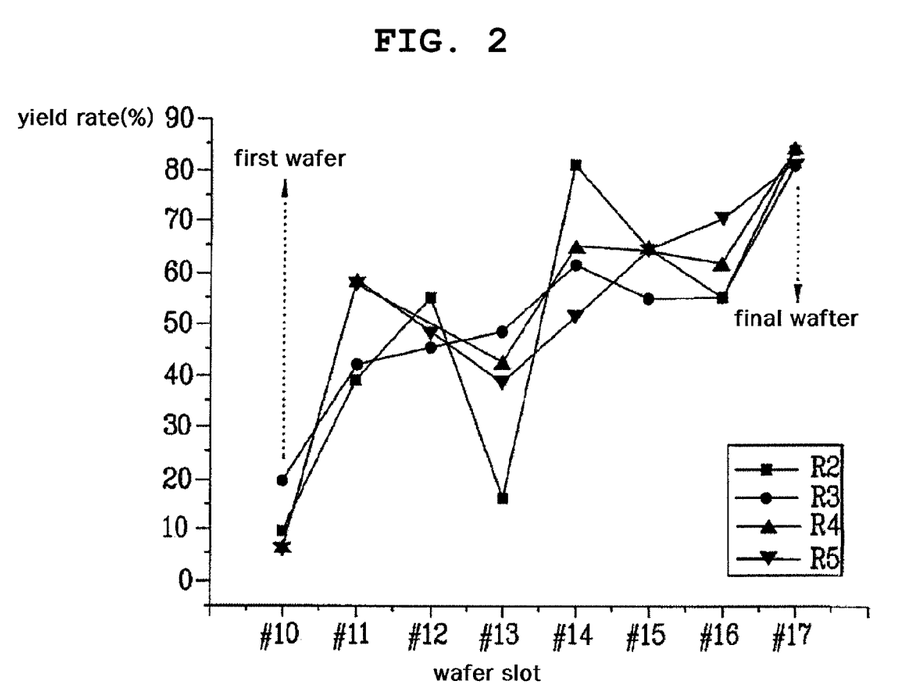
FIG. 2 is a graph illustrating a yield rate per each wafer slot of the representative lot showing slot dependency.

Example FIG. 2 is a graph illustrating a yield rate for each wafer slot in the representative lot showing slot dependency. For this example, the fifth lot (lot E) was selected as the representative lot. As illustrated in FIG. 2, the yield rate gradually improved from the first wafer to the final wafer.

Three types of analysis may be performed with respect to lots showing S/D. A first type of analysis may quantitatively standardize S/D in the form of mean values and standard deviation, for example by accumulating yield rate data in the sequence of the wafers. A second type of analysis may check the difference of the failure mode between the first wafer and the final wafer in each lot. A third type of the analysis may quantitatively standardize a failure rate according to the die position in the wafer to identify meaningful and/or a relevant difference of the yield rate in each specific region of the wafer.

Figure 3:
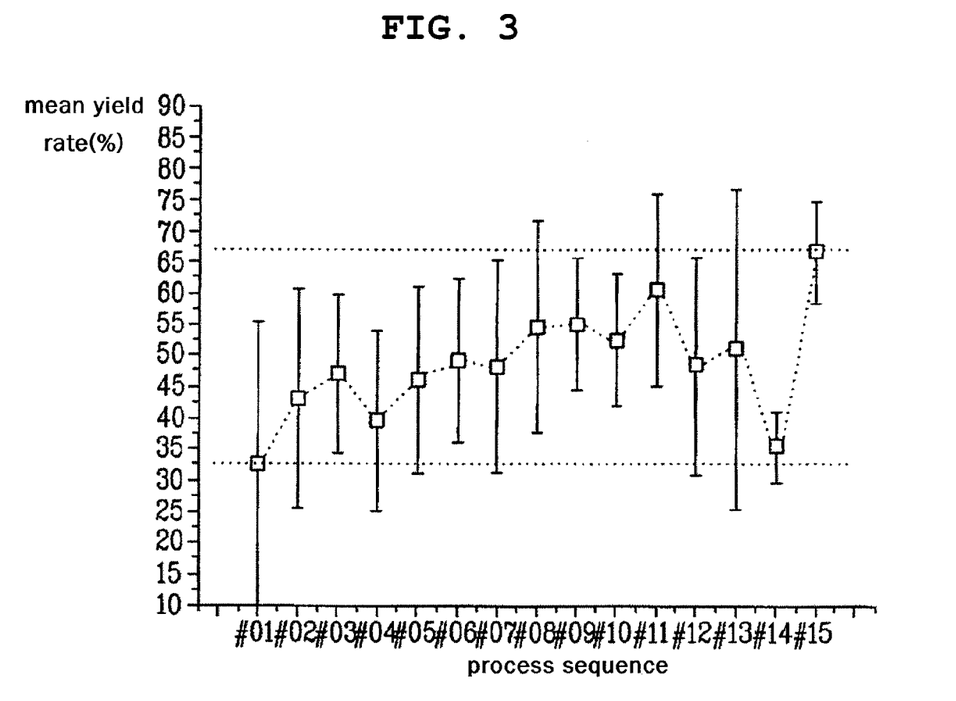
FIG. 3 is a graph illustrating a mean yield rate of wafers according to a process sequence.

Example FIG. 3 is a graph illustrating a mean yield rate of wafers according to a process sequence performed in accordance with the first type of analysis. In FIG. 3, the x-axis represents wafers according to the process sequence, in which the wafers are provided in each of nine lots (lot E to lot M) used in example FIG. 9. Reference numerals #01 to #15 are provided to denote the wafers. The wafers having lower numbers may undergo each unit process prior to the wafers having higher numbers. The y-axis represents a mean yield rate, which is obtained by taking the monitoring result of the 4M SRAM (R2 to R5) into consideration.

As illustrated in FIG. 3, a difference of the yield rate between first wafer #01 and final wafer #15 is about 34%. Accordingly, wafers provided in one lot show a high S/D difference depending on the process sequence.

When examining these results based on a Pearson correlation coefficient using a statistical program, the r-value is 0.808, and the p-value is 0.000. This indicates that there is a strong positive correlation between the process sequence of the wafer and S/D. As a result, it can be concluded that S/D is a factor that tends to lower a yield rate.

According to the second type of analysis, differences between the failure modes and the number of the failure modes between the first wafer and the final wafer were analyzed. As shown in Table 1, the primary failure mode of lots showing S/D may include partial failure, 1bit failure and col2 bit failure. In the case of 1bit failure, the difference between the number of failures in the first wafer and the final wafer was not great, but 1bit failure may negatively affect the yield rate of the semiconductor device. Accordingly, it may be beneficial to reduce partial and col2 bit failures related to the BEOL process for semiconductor devices and 1bit failure related to an FEOL process for semiconductor devices, to attempt to improve a yield rate of a semiconductor device. Partial failure, as well as column failure, primarily occurs when a bridge type defect occurs in the BEOL metal interconnection. In addition, the col2 bit failure primarily occurs when a microbridge type defect and an open defect of a contact occur.

TABLE 1

| | | failure mode | | | | | | | |
| | | First wafer | | | | Final wafer | | | |
| | lot | partial | bit1 | bit2col | bit2col | partial | bi1 | bit2col | bit2col |
| --- | --- | --- | --- | --- | --- | --- | --- | --- | --- |
| Non-S/D | lot | 11 | 432 | 69 | 67 | 203 | 2338 | 659 | 256 |
| group | lotC | 1 | 104 | 82 | 86 | 181 | 1228 | 568 | 351 |
| | lotD | 2 | 79 | 16 | 15 | 2 | 121 | 49 | 45 |
| | Sum | 14 | 615 | 167 | 168 | 386 | 3687 | 1276 | 652 |
| S/D | lotE | 2185 | 3647 | 2122 | 2566 | 0 | 133 | 0 | 0 |
| | lotF | 2805 | 21147 | 11418 | 7578 | 4 | 171 | 17 | 33 |
| | lotG | 71 | 860 | 335 | 263 | 0 | 37 | 1 | 0 |
| | lotH | 239 | 1286 | 705 | 747 | 0 | 36 | 159 | 160 |
| | loti | 2 | 291 | 5 | 39 | 2 | 4 | 1800 | 1799 |
| | lotJ | 368 | 1592 | 14307 | 14610 | 0 | 17 | 119 | 106 |
| | lotK | 1506 | 7722 | 4347 | 5378 | 2868 | 51373 | 6970 | 7473 |
| | Sum | 7176 | 36545 | 33239 | 31181 | 2874 | 51771 | 9066 | 9571 |

According to the third type of analysis, a failure rate may be quantitatively standardized according to a die position in the wafer, and a significant and/or relevant difference between the yield rate in each specific region of the wafer may be checked.

Figure 4:
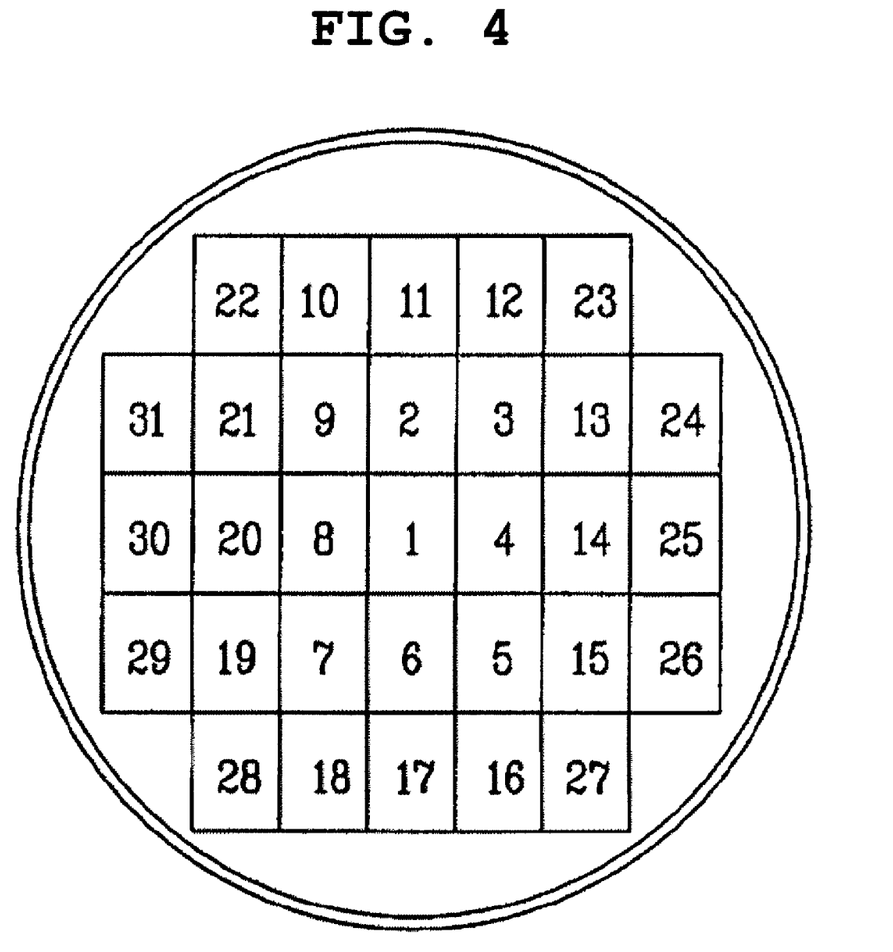
FIG. 4 is a view illustrating a die position map of a wafer.

Example FIG. 4 illustrates a die position map of the wafer. Numbers may be assigned to each die formed on the wafer. Dies having higher numbers may be positioned at an outer peripheral area of the wafer.

Figure 5:
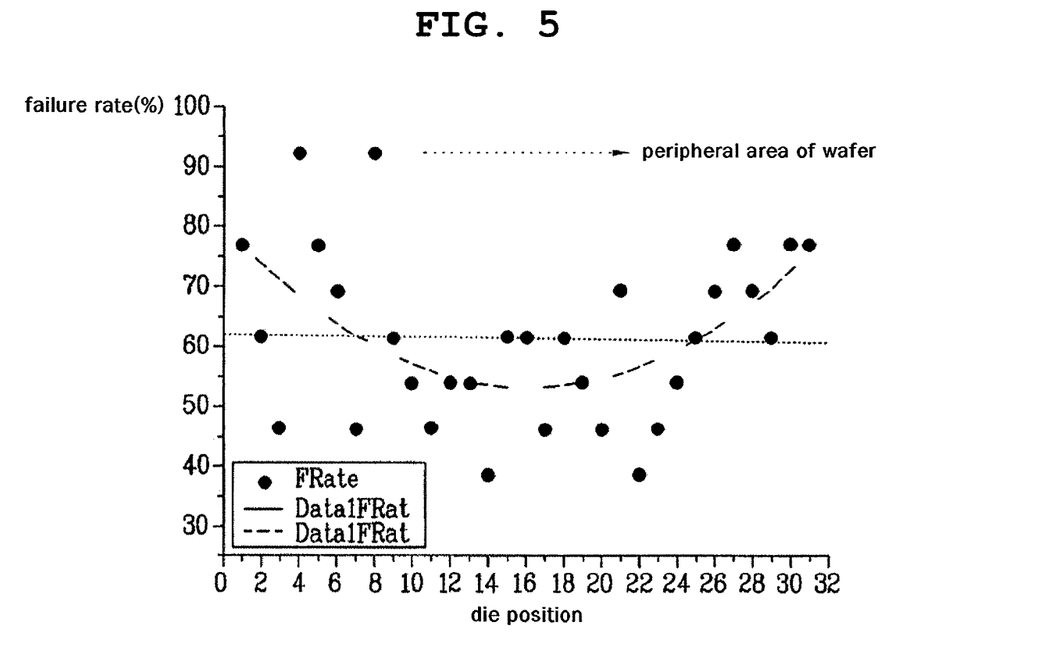
FIG. 5 is a graph illustrating a failure rate of lots that do not represent slot dependency.
Figure 6:
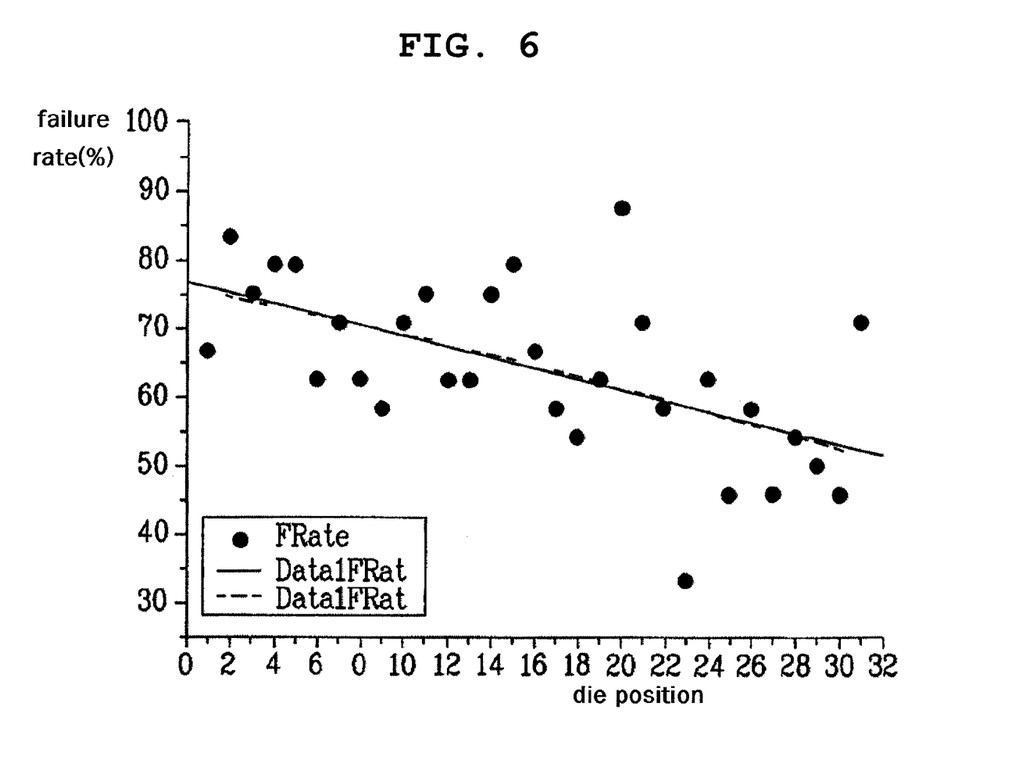
FIG. 6 is a graph illustrating a failure rate of lots that represent slot dependency.

Example FIG. 5 is a graph illustrating a failure rate of lots that do not represent slot dependency. As illustrated in FIG. 5, there is no meaningful difference between the center area and the outer peripheral area of the wafer in the lots that do not represent S/D.

example FIG. 6 is a graph illustrating a failure rate of lots that represent slot dependency. According to a Pearson correlation coefficient, which was obtained based on data illustrated in FIG. 6 using a statistical program, the r-value is 0.576, and the p-value is 0.001. This indicates that a negative correlation exists between the failure rate and the die position. That is, a center area of a wafer has a higher failure rate than other areas. Accordingly, there is a high correlation between S/D of the semiconductor device and the higher failure rate in the center area of the wafer. In other words, if the lots exhibit S/D, a higher failure rate occurs at the center area of the wafer.

Accordingly, since S/D may directly affect a yield rate of SRAM, S/D may be reduced by lowering the failure rate of the center area of the wafer, which directly influences the yield rate of the wafer.

Embodiments may provide a method of lowering and/or minimizing the three main failure modes (partial failure, 1bit failure, and col2 bit failure). That is, to improve the yield rate of the SRAM, embodiments may reduce failure rates at a center area of a wafer, thereby reducing partial failure, 1bit failure, and col2 bit failure.

Since items for reducing the 1bit failure in the BEOL process may be variously applied to the lots (yield rate monitoring lots), additional items may be applied as an extension of the above items.

To reduce partial failure (or column failure) and col2 bit failure in the BEOL process, meaningful differences of electric parameters between a center area and an outer peripheral area of a wafer may be primarily analyzed by using PCM map data. As described above, since 1bit failure rarely influences the map tendency of the wafer, it may be important to determine a current status through failure analysis and to reduce 1bit failure by applying split items.

Figure 7:
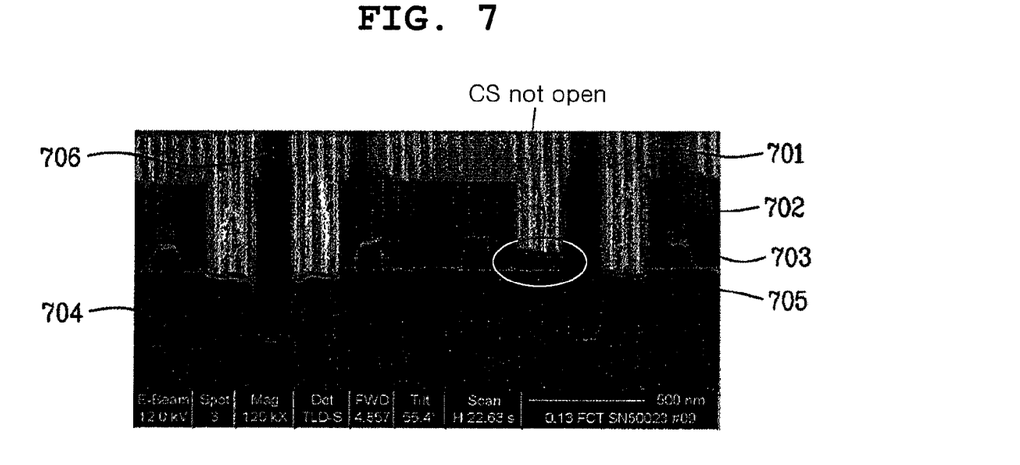
FIG. 7 is an FIB (focus ion beam) image illustrating "CS not open" type 1bit failure.

Example FIG. 7 is an FIB (focus ion beam) illustrating "CS not open" type 1bit failure, and Table 2 recites the split items that may be utilized to reduce 1bit failure.

TABLE 2

| # | Split items | object | status |
|---|---|---|---|
| 1 | (megasonic) cleaning after Si etch for STI | particle reduction | applied to product |
| 2 | cleaning before spacer TEOS deposition | | |
| 3 | cleaning after spacer TEOS deposition | | |
| 4 | cleaning after ion implantation and | | |
| 5 | cleaning after forming Co salicide | | |
| 6 | cleaning after forming contact barrier | | |
| 7 | WF6 gas delay time of initial step in W | W-fill particle reduction | |
| 8 | addition of scrubber (cleaning) after contact barrier metal(liner) process and | | |
| 9 | pre-cleaning for non salicide side | | |
| 10 | back side brush cleaning after salicide | | |
| 11 | change of filter material (Nylon) of DUV | | test status |
| 12 | Cleaning before sidewall annealing process | | |
| 13 | equipment (M/C, machine) for gate etching | | |

Table 2 illustrates that most actions taken to reduce 1bit failure relate to reducing particles.

Example FIG. 7 illustrates copper interconnection 701, plug 702, gate electrode 703, STI 704, particles 705, and insulating layer 706.

Figure 8:
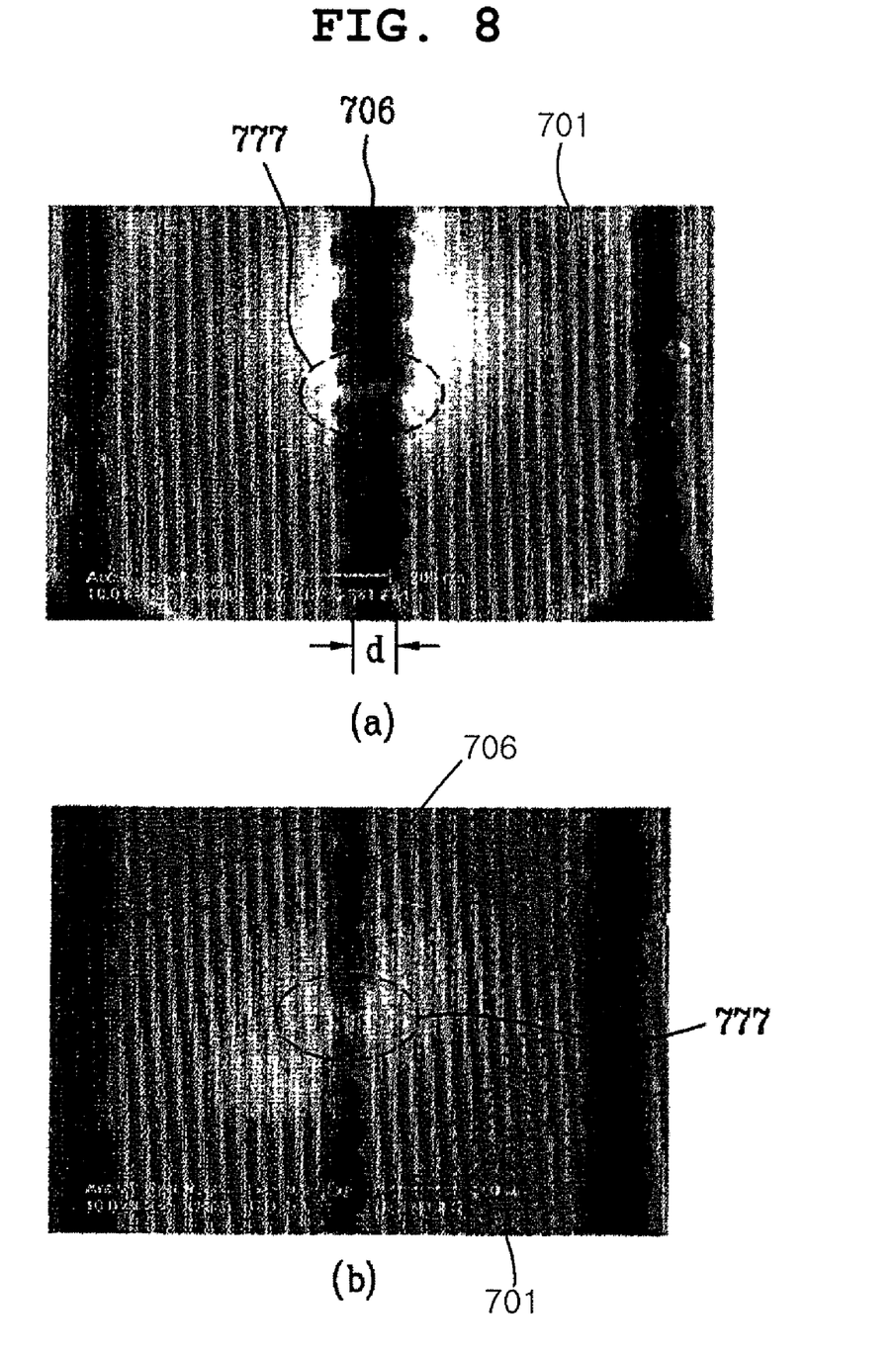
FIG. 8 illustrates a short between copper interconnections caused by a bridge defect.

A partial failure of the BEOL process, which may lower a yield rate of a semiconductor device, may occur due to a bridge type defect causing a short of copper interconnection 701, as illustrated in example FIG. 8. The insulating layer 706 illustrated in FIG. 8a has a width (d) different from that of the insulating layer 706 illustrated in FIG. 8b. According to a test result for a comb pattern that determines the open/short status of copper interconnection 701, the short occurs in copper interconnection 701 illustrated in FIG. 8a and FIG. 8b, respectively. Thus, the short failure of copper interconnection 701 may frequently occur at the center area of a wafer as compared with an outer peripheral area of the wafer.

Embodiments may use at least two ways to remove a cause of the bridge type defect. One way is to increase DICD of a weak cell space, which is detected in the SRAM cell area, by approximately 10 nm. Another way is to minimize a serration phenomenon by improving conditions of the RIE (Reactive Ion Etching) process. The cell space CD may refer to a width (d) of the insulating layer.

During the photo (lithography) process, photoresist may be coated on the wafer, and a photoresist pattern may then be formed on the wafer through an exposure and development process. The DICD refers to the CD (critical dimension) of the photoresist pattern.

In addition, after the photo process has been completed, an etching process may be performed to form a pattern on the wafer according to the photoresist pattern. The FICD refers to the CD of the pattern formed on the wafer.

An exemplary process of increasing DICD of a weak cell will be described in additional detail.

Figure 9:
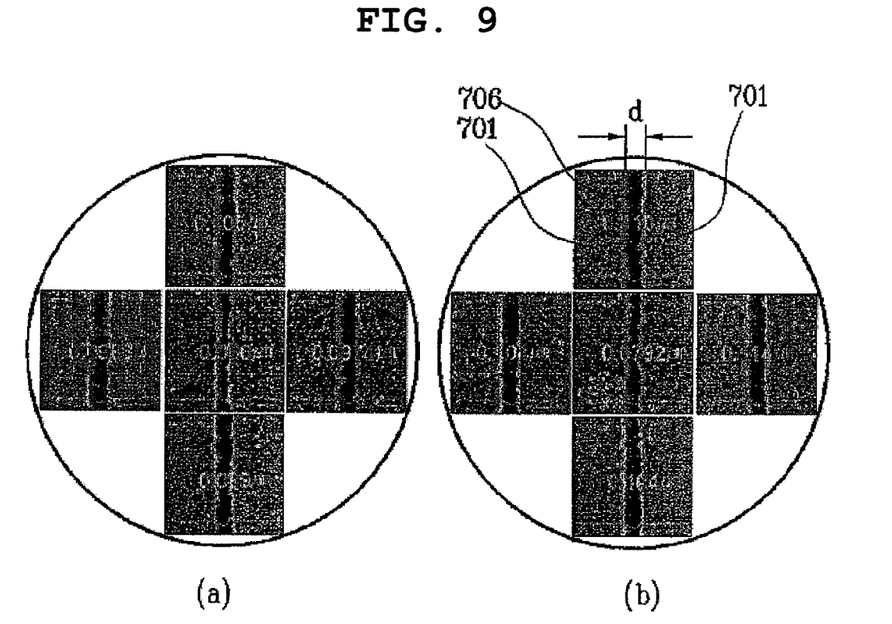
FIG. 9 is a view comparing a related art cell space with a cell space according to embodiments.

According to embodiments, the DICD may be $0.210 \pm 0.020$ μm, and the FICD may be $0.2050 \pm 020$ μm. Example FIG. 9 illustrates a top view image of a cell space area before and after DICD adjustment after the CMP (chemical mechanical polishing) process has been finished. Thus FIG. 9a illustrates a cell space area before the DICD is increased, and FIG. 9b illustrates a cell space area after the DICD has been increased, for example by approximately 10 nm. The width of the insulating layer may increase as the DICD becomes increased.

Based on the above described result, embodiments may represent the DICD and FICD as a ratio.

If a photo process is carried out relative to a wafer, photoresist patterns may be formed on the wafer. Thus, if an insulating layer is etched based on photoresist patterns, a predetermined portion of the insulating layer corresponding to the photoresist patterns may not be etched, but a predetermined portion of the insulating layer corresponding to gaps formed between the photoresist patterns may be etched to form a trench.

In the case of DICD, the width ratio of the gap to the photoresist pattern may be in a range of approximately 0.46 to 0.56. In the case of the FICD, the width ratio of the trench to the insulating layer may be in a range of approximately 0.45 to 0.55.

Next, minimizing a serration phenomenon will be described in additional detail.

There are at least two methods to refine the process conditions to improve/reduce a serration phenomenon after the trench RIE (Reactive Ion Etching) process. One method is to adjust an amount of polymer gas ($CHF_3$) during the trench RIE process, and another method is to adjust the duration of a fence removal step in the trench RIE process.

Figure 10:
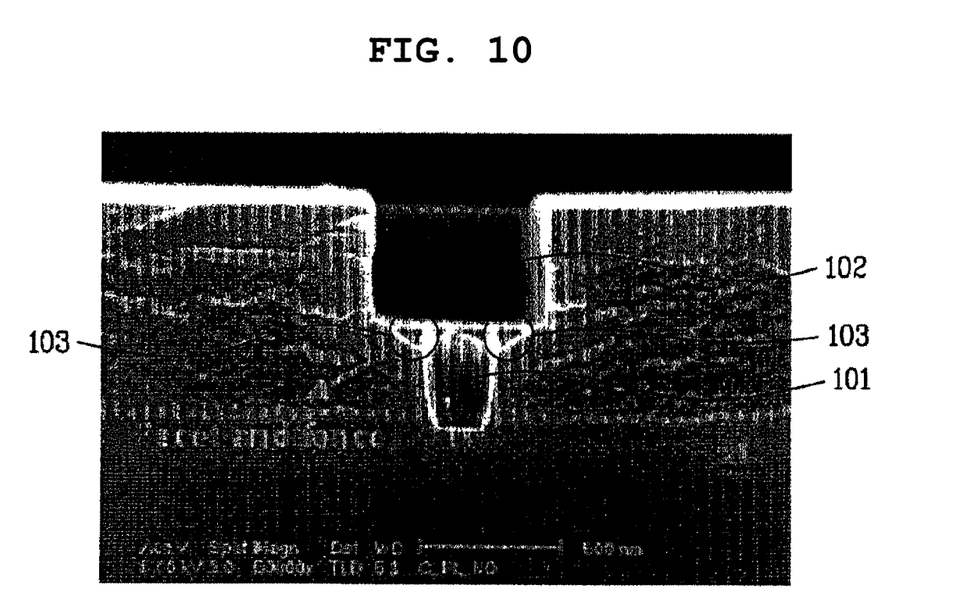
FIG. 10 illustrates a fence.

Example FIG. 10 illustrates a fence. As illustrated in FIG. 10, via hole pattern 101 may be formed to form a dual damascene pattern. Trench pattern 102 may then be formed through a via first scheme. If the process conditions are not optimized after completion of the etching process used to form trench pattern 102, impurities, e.g. fence 103, may remain on a border between trench pattern 102 and via hole pattern 101. Fence 103 detrimentally affect subsequent processes of forming a barrier layer and a seed layer, thereby deteriorating the quality of a copper interconnection. Thus, the fence removal step may be performed to reduce and/or minimize formation of fence 103.

Figure 11:
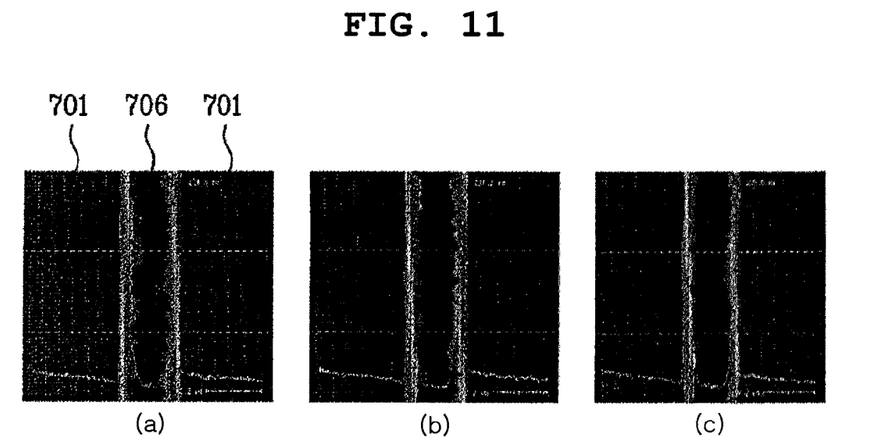
FIG. 11 illustrates a serration phenomenon depending on the amount of $CHF_3$.
Figure 12:
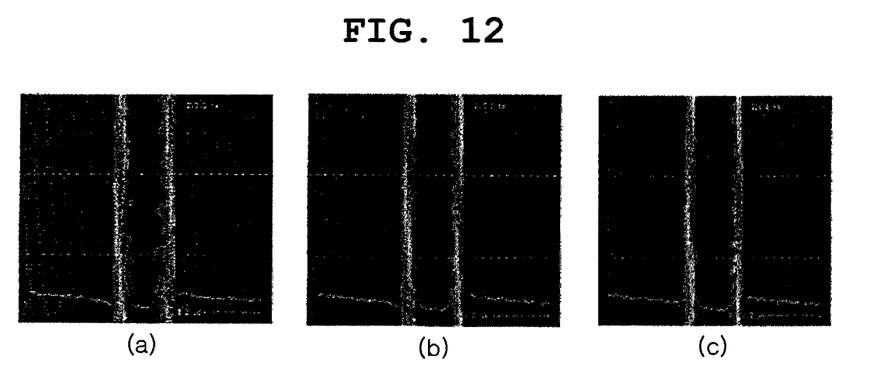
FIG. 12 illustrates a serration phenomenon depending on the process time; and Example

Example FIG. 11 illustrates the serration phenomenon depending on an amount of $CHF_3$, and example FIG. 12 illustrates the serration phenomenon depending on the process time.

As indicated in FIG. 11, the trench may be formed under basic process conditions, for example of pressure of 150 mT, temperature of 400° C., 200 sccm Ar, 50 sccm $CF_4$, and 9 sccm $O_2$. Example FIG. 11(a), FIG. 11(b) and FIG. 11(c) represent $CHF_3$ of 10 sccm, 20 sccm, 15 sccm, respectively.

As indicated in FIG. 12, the fence may be removed under basic process conditions, for example of pressure of 480 mT, temperature of 400° C., 15 sccm $CF_4$, 600 sccm $N_2$, and 500 sccm $H_2$. FIG. 12(a), FIG. 12(b) and FIG. 12(c) represent process times of approximately 15 seconds, 10 seconds and 5 seconds, respectively.

The serration phenomenon rarely occurs under 15 sccm $CF_3$, and rarely occurs when the fence removal step is performed for 5 seconds.

Figure 13:
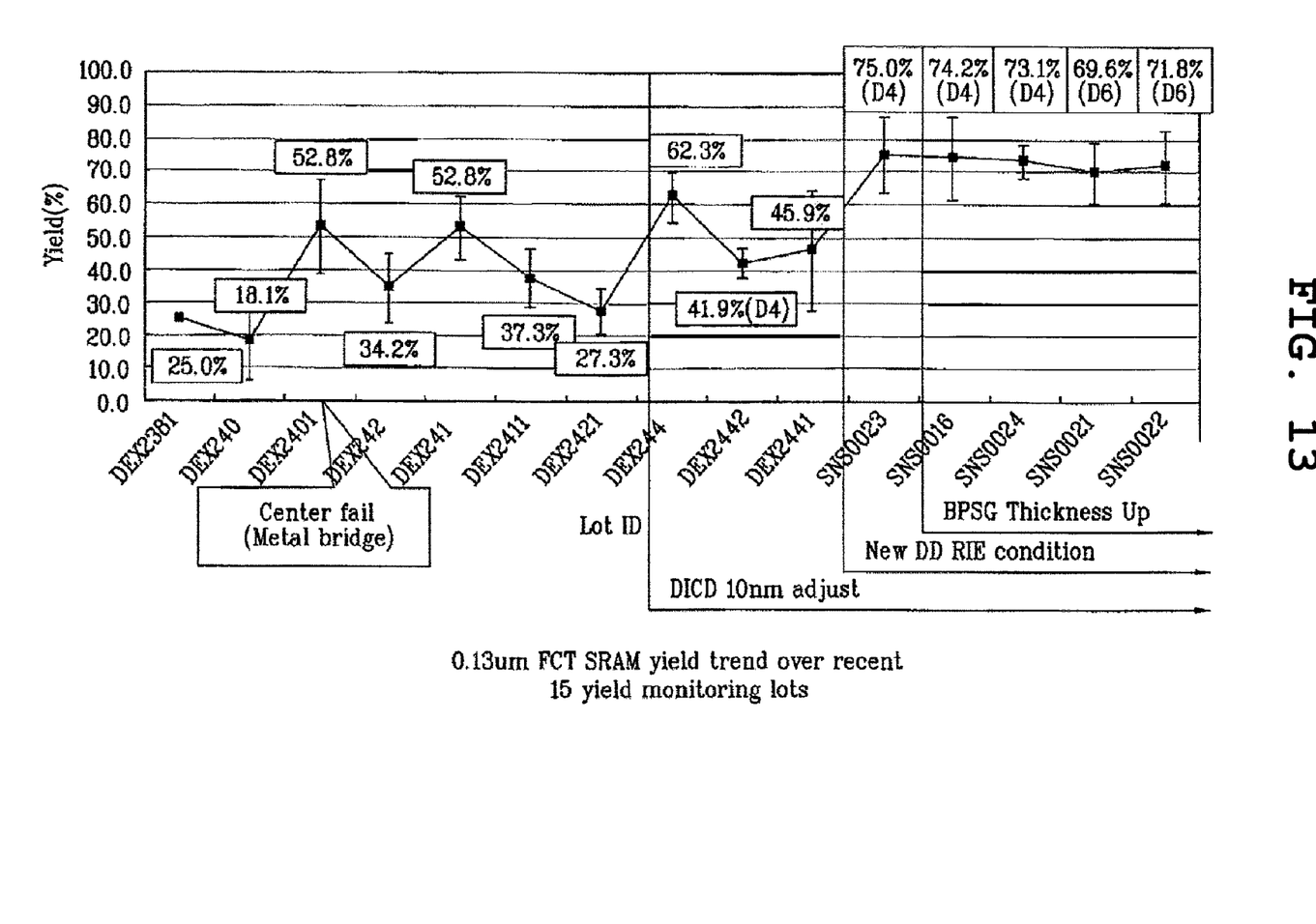
FIG. 13 is a graph illustrating a result of the SRAM yield rate for 15 lots when the method according to embodiments is applied.

Example FIG. 13 is a graph illustrating a result of the SRAM yield rate for 5 lots when the above described actions regarding improving the yield rate are applied. The SRAM yield rate of the 5 lots is relatively high. When monitoring the SRAM yield rate by optimizing the DICD and improving the process conditions, the SRAM yield rate is maintained at 70% or more in the 5 lots. This result illustrates that there may be no meaningful difference of yield rate between a center area and an outer peripheral area of a wafer. In addition, S/D may also be improved.

According to embodiments, the SRAM yield rate may be increased by approximately 26% as compared with previously described methods of 47.1%, which is a mean SRAM yield rate obtained from 13 lots described earlier. Moreover, other related art methods include degradation of the yield rate at the center area of the wafer. However, according to embodiments, the SRAM yield rate at the center area of the wafer is similar to the SRAM yield rate at the outer peripheral area of the wafer.

As described above, embodiments may improve a yield rate of semiconductor devices by enlarging a cell space area and reducing a time for a fence removal process.

It will be apparent to those skilled in the art that various modifications and variations can be made to embodiments. Thus, it is intended that embodiments cover modifications and variations thereof within the scope of the appended claims.

What is claimed is:

1. A method comprising:
    preparing a substrate including a plurality of conductive patterns;
    forming an insulating layer on the substrate;
    forming a plurality of trenches by selectively etching the insulating layer; and
    forming a metal interconnection in each trench, wherein a width of the insulating layer positioned between adjacent trenches is in a range of approximately 0.185 μm to 0.225 μm.

2. The method of claim 1, wherein forming the trenches comprises:
    forming a photoresist on the insulating layer;
    selectively exposing the photoresist using a mask to form a plurality of photoresist patterns; and
    etching the insulating layer using the photoresist patterns as an etch mask to form the plurality of trenches.

3. The method of claim 2, wherein a width of the photoresist pattern aligned between adjacent trenches is in a range of approximately 0.19 μm to 0.23 μm.

4. A method comprising:
    preparing a substrate including a plurality of conductive patterns;
    forming first and second insulating layers on the substrate;
    forming a plurality of via holes by selectively etching the first and second insulating layers;
    forming a plurality of trenches by selectively etching the second insulating layer such that the trenches are configured to be communicatively coupled to the via holes; and
    forming metal interconnections in the trenches and via holes, wherein a width of the insulating layer positioned between adjacent trenches is in a range of approximately 0.185 μm to 0.225 μm.

5. The method of claim 4, wherein forming the via holes comprises:
    forming a photoresist on the second insulating layer;
    selectively exposing the photoresist using a mask to form a plurality of photoresist patterns; and
    etching the first and second insulating layers using the photoresist patterns as an etch mask to form the plurality of via holes.

6. The method of claim 4, wherein forming the trenches comprises:
    forming a photoresist on the second insulating layer;
    selectively exposing the photoresist using a mask to form a plurality of photoresist patterns; and
    etching the second insulating layer using the photoresist patterns as an etch mask to form the plurality of trenches.

7. The method of claim 6, wherein a width of the second photoresist pattern aligned between adjacent trenches is in a range of approximately 0.19 μm to 0.23 μm.

8. The method of claim 4, comprising removing a fence formed between at least one via hole and at least one trench.

9. The method of claim 8, wherein the fence is removed through an RIE (Reactive Ion Etching) process, and wherein the RIE process is performed for approximately 3 to 5 seconds using $CHF_3$ gas having a flow rate in a range of approximately 12 sccm to 18 sccm.

10. A method comprising:
    preparing a substrate having a plurality of conductive patterns;
    forming an insulating layer on the substrate;
    forming a plurality of trenches by selectively etching the insulating layer; and
    forming a metal interconnection in each trench, wherein a ratio of a width of the trench to a width of the insulating layer positioned between adjacent trenches is in a range of 0.45 to 0.55.

11. The method of claim 10, wherein forming the trenches comprises:
    forming photoresist on the insulating layer;
    selectively exposing the photoresist using a mask to form a plurality of photoresist patterns; and
    etching the insulating layer using the photoresist patterns as an etch mask to form the plurality of trenches.

12. The method of claim 11, wherein a ratio of a width of a gap formed between the photoresist patterns to a width of the photoresist pattern is in a range of 0.46 to 0.56.

13. A method comprising:

preparing a substrate including a plurality of conductive patterns;

forming first and second insulating layers on the substrate;

forming a plurality of via holes by selectively etching the first and second insulating layers;

forming a plurality of trenches by selectively etching the second insulating layer such that at least one trench is configured to be in electrical communication with at least one via hole; and forming metal interconnections in the via holes and the trenches, wherein a ratio of a width of the trench to a width of the insulating layer positioned between adjacent trenches is in a range of approximately 0.45 to 0.55.

14. The method of claim 13, wherein forming the via holes comprises:

forming a photoresist on the second insulating layer;

selectively exposing the photoresist using a mask to form a plurality of photoresist patterns; and etching the first and second insulating layers using the photoresist patterns as an etch mask to form the plurality of via holes.

15. The method of claim 13, wherein forming the trenches comprises:

forming a photoresist on the second insulating layer;

selectively exposing the photoresist using a mask to form a plurality of photoresist patterns; and etching the second insulating layer using the photoresist patterns as an etch mask to form a plurality of trenches.

16. The method of claim 15, wherein a ratio of a width of a gap formed between the photoresist patterns to a width of the photoresist pattern is in a range of 0.46 to 0.56.

17. The method of claim 13, further comprising removing a fence formed between at least one via hole and at least one trench.

18. The method of claim 17, wherein the fence is removed through an RIE (Reactive Ion Etching) process using $CHF_3$ gas.

19. The method of claim 18, wherein the RIE process is performed for 3 to 5 seconds.

20. The method of claim 18, wherein $CHF_3$ gas has a flow rate of between 12 sccm to 18 sccm.

* * * * *